United States Patent [19]

Fischer

[11] Patent Number: 5,039,963
[45] Date of Patent: Aug. 13, 1991

[54] METHOD FOR REDUCING SIGNAL-DEPENDENT DISTORTION IN SWITCHED-CAPACITOR FILTERS OR THE LIKE

[75] Inventor: Jonathan H. Fischer, Blandon, Pa.

[73] Assignee: AT&T Bell Laboratories, Murray Hill, N.J.

[21] Appl. No.: 471,170

[22] Filed: Jan. 26, 1990

[51] Int. Cl.$^5$ ............................................. H03H 19/00
[52] U.S. Cl. ....................................... 333/173; 330/9
[58] Field of Search ................ 333/173, 214; 307/520; 330/107, 109, 9, 51; 328/167, 151

[56] References Cited

U.S. PATENT DOCUMENTS

| | | | |
|---|---|---|---|
| 4,313,096 | 1/1982 | Fleischer | 333/173 |
| 4,315,227 | 2/1982 | Flerscher et al. | 333/173 |
| 4,498,063 | 2/1985 | Makabe et al. | 333/123 |
| 4,531,106 | 7/1985 | Ganesam | 333/173 |
| 4,574,250 | 3/1986 | Senderowicz | 333/109 X |
| 4,716,388 | 12/1987 | Jacobs | 333/173 |
| 4,833,691 | 5/1989 | Takatori et al. | 333/173 X |
| 4,857,860 | 8/1989 | Sevastopoulous | 333/9 X |
| 4,920,325 | 4/1990 | Nicollini et al. | 333/173 |

FOREIGN PATENT DOCUMENTS 0291214 12/1987 Japan ................................. 333/173

OTHER PUBLICATIONS

"Low-Distortion Switched-Capacitor Filter Design Techniques", *IEEE Journal of Solid-State Circuits*, vol. SC-20, No. 6, Dec. 1985, pp. 1103 through 1112, Kuang-Lee, Robert G. Meyer.

"Parasitic Insensitive, Biphase Switched Capacitor Filters Realized With One Operational Amplifier Per Pole Pair", *The Bell System Technical Journal*, May/Jun. 1982, vol. 61, No. 5, pp. 685 through 707, K. R. Laker, P. E. fleischer, A Ganesan.

*Primary Examiner*—Eugene R. LaRoche
*Assistant Examiner*—Seung Ham
*Attorney, Agent, or Firm*—S. W. McLellan

[57] ABSTRACT

A method of switching a switched-capacitor circuit to reduce signal-dependent distortion resulting from the switching operation. Two single-pole, double-throw switches in the array, having the switched capacitor coupling between to the common terminals thereof, are alternately switched without the use of an intermediate (no-make) state.

5 Claims, 4 Drawing Sheets

METHOD FOR REDUCING SIGNAL-DEPENDENT DISTORTION IN SWITCHED-CAPACITOR FILTERS OR THE LIKE

BACKGROUND OF THE INVENTION

1. Field of the Invention

This invention relates to switched-capacitor circuits in general and, more particularly, to switched-capacitor filters used in high-fidelity applications.

2. Description of the Prior Art

Switched-capacitor (S-C) circuits are used in a variety of applications, such as filters, Δ-Σ analog-to-digital and digital-to-analog converters, etc. These circuits are readily integratable with other circuits, making them useful in VLSI applications. In particular, the use of S-C circuits for digital audio applications is receiving much attention as a way of reducing the cost of the integrated circuits therein by integrating more functions onto fewer chips. However, S-C circuits as known in the prior art are not best suited for high-fidelity/low-noise applications such as digital audio; the signal distortions and self-generated noise produced by S-C circuit operation can dominate the dynamic range and low noise level that digital audio techniques are capable of.

An exemplary general purpose S-C filter is presented in an article titled *Parasitic Insensitive, Biphase Switched Capacitor Filters Realized With One Operational Amplifier Per Pole Pair* by K. R. Laker, P. E. Fleischer, and A. Ganesan, Bell System Technical Journal, Vol. 61, No. 5, May/June 1982, pp. 685-707. As shown in FIG. 4a of the above-identified article, capacitor A is switched by two switches, one switch switching between a signal and ground, while the other switch alternately couples capacitor A between the input of amplifier 11 and ground. Capacitor A is shown as being "diagonally" switched, while capacitor C is "through" switched. For purposes here, either type of switching, or a combination of the switching types, may be used in a S-C circuit.

The switching of capacitor A is typically a break-before-make arrangement such that the contacts of the respective switch are not coupled together at any time. This is accomplished by using non-overlapping clocks to drive each portion of the switch coupling between a corresponding contact and a common point thereof. Further, both switches associated with capacitor A (or capacitor C) operate at substantially the same time, usually driven by the same clock signals.

The method of switching the switches at substantially the same time produces two major kinds of distortion. One type of distortion is clock feedthrough and charge injection, where the clock signal driving a switch couples through the switch and corrupts the desired signal. Another kind of distortion is dependent on the signal level, commonly referred to as signal-dependent distortion. The first kind of distortion, the clock feedthrough and charge injection, is addressed in *Low-Distortion Switched-Capacitor Filter Design Techniques*, by Lee and Meyer, IEEE Journal of Solid-State Circuits, Vol. SC-20, No. 6, Dec. 1985, pp. 1103-1112. In Lee and Meyer,, the individual switches are significantly delayed in their operation such that the switches do not operate simultaneously. To illustrate this switching technique, a simplified S-C circuit, here a low-pass filter, is shown in FIGS. 4a14 4e, of this patent application, for one-half of a complete switching cycle. Note that this simplification removes the differential operation of the Lee and Meyer circuit and is for illustrative purposes. Initially, as shown in FIG. 4a, an exemplary filter 40 has switches 41, 42 coupling capacitor 43 between a first signal source 44 and ground. Then switch 42 enters a neutral position, as shown in FIG. 4b. Next, switch 41 enters a neutral position, as shown in FIG. 4c. Note that capacitor 43 is now not coupled to any signal or node; it is completely "floating". Switch 42 then completes its transition, coupling capacitor 43 to the inverting input of operational amplifier 46, shown in FIG. 4d. Note that the operational amplifier 46 is configured such that the input thereto is at virtual ground by virtue of the non-inverting input thereof connecting to ground and capacitor 47 coupling the output of the amplifier 46 back to the inverting input thereof. Finally, switch 41 completes its transition by coupling capacitor 43 to a second signal source 45, as shown in FIG. 4e. For the filter 40 to return to the initial state shown in FIG. 4a, the above-described steps are repeated but for the different initial positions of the switches 41, 42. This switching method class result in reduced clock feedthrough and charge injection than from the simultaneous switching method, discussed above. Although the signal-dependent distortion is reduced, the reduction is insufficient for low distortion applications.

SUMMARY OF THE INVENTION

Therefore, one aspect of this invention is a method of switching capacitors in a switched-capacitor circuit so that the signal-dependent distortion generated by the switching process is reduced.

These and other aspects of the invention are provided for generally by a new method of switching a capacitor in a switched-capacitor circuit. The circuit includes at least: first and second switches, each having two contacts and a common; a capacitor connected between the commons of the two switches; a first signal source coupling to one contact of the first switch; and, an a first amplifier having a virtual ground input, the virtual ground input coupling to one contact of the second switch. The capacitor is switched by alternately switching the first and second switches directly from one contact to the other contact in each switch.

BRIEF DESCRIPTION OF THE DRAWING

The foregoing features of this invention, as well as the invention itself, may be more fully understood from the following detailed description of the drawings, in which.

DETAILED DESCRIPTION

Figure 1A:
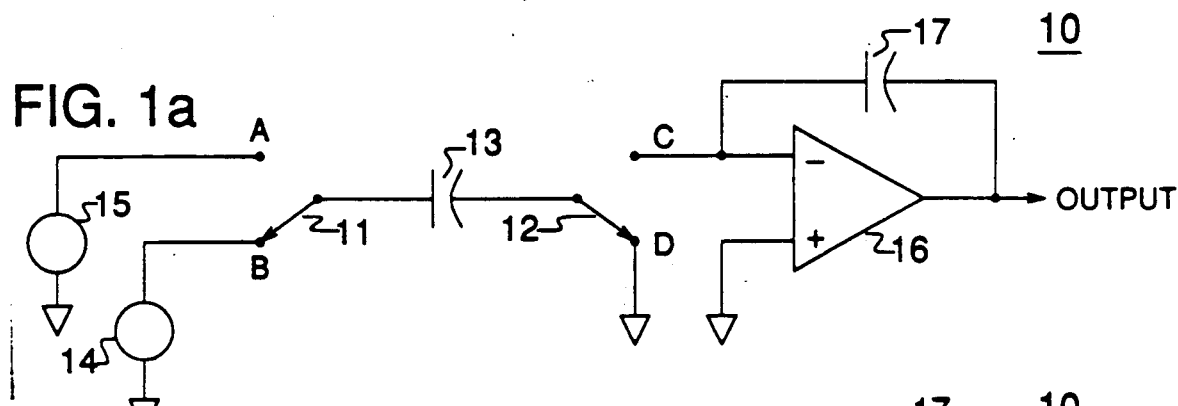
FIGS. 1a-1d are simplified schematic diagrams of an exemplary switched-capacitor filter demonstrating the method of switching the capacitor therein according to one embodiment of the invention.

The new method of switching a capacitor to reduce the signal-dependent distortion, in accordance with one aspect of the invention, is discussed below. Before discussing the details of the invention, a brief, general, discussion of switch terminology is given herein. The switches used to switch the capacitors therein are typically single-pole, double-throw, such that each switch has two "contacts" and a common. When a switch switches, or "operates", the common is disconnected from one contact and is connected to the other. As will be explained in more detail below in connection with FIG. 2, the switches are break-before-make, such that there is no unintended conduction path between contacts when the switch operates. This is referred to as an intermediate, no-make, or "floating", state. Hence, there is brief amount of time when the common does not connect to either contact; the length of that time may be changed as necessary.

One embodiment of the invention, a new method of switching a capacitor in a switched-capacitor (S-C) circuit 10 is illustrated in FIGS. 1a–1d. As discussed above in connection with FIGS. 4a–4e, the S-C circuit 10 is characterized by first and second switches 11, 12 having two contacts each, A, B and C, D, respectively. The common of each switch 11, 12 couples to capacitor 13. Amplifier 16 is configured to have the inverting input thereof a virtual ground input by virtue of the non-inverting input coupling to AC ground (or any substantially invariant voltage level, as necessary) and the inverting input coupling to the output via feedback capacitor 17. To reduce the signal-dependent distortion caused by the switches 11, 12, they are made to operate alternately such that each switch completes the switch from one contact to the other contact before the other switch so operates.

Figure 1B:
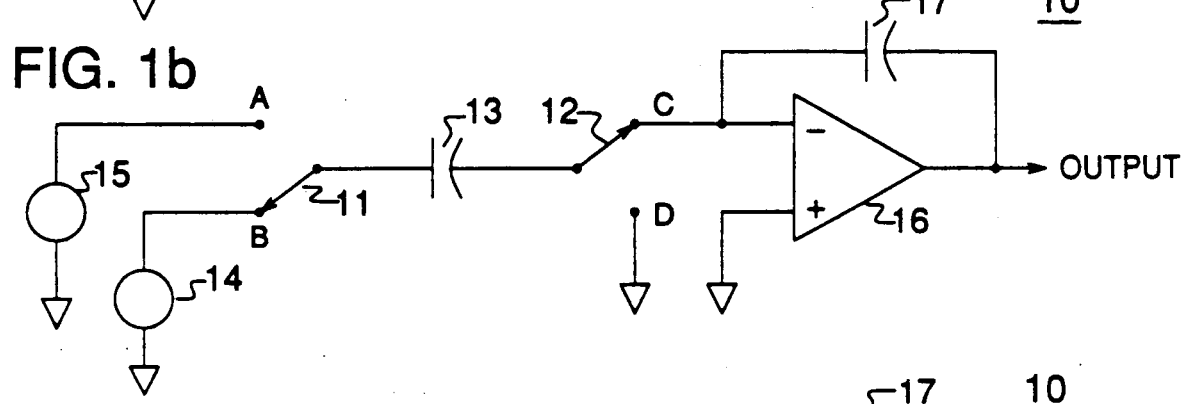
Figure 1C:
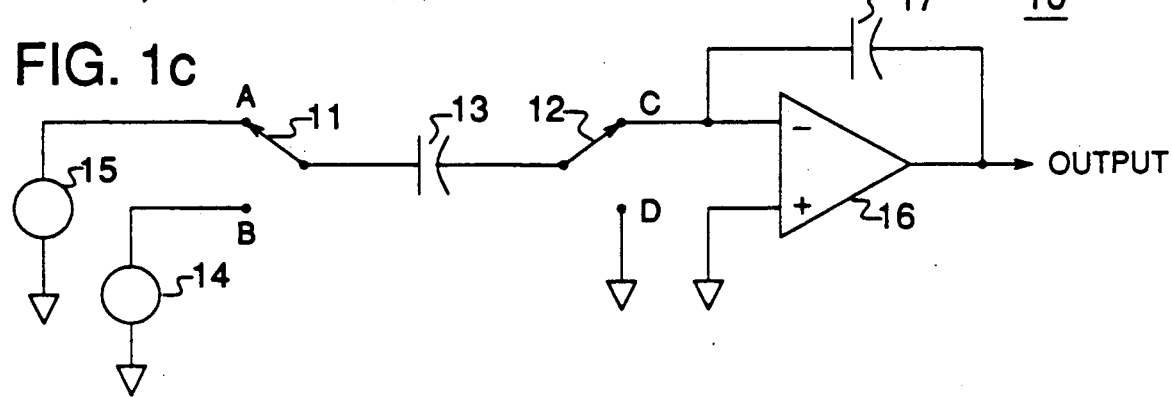
Figure 1D:
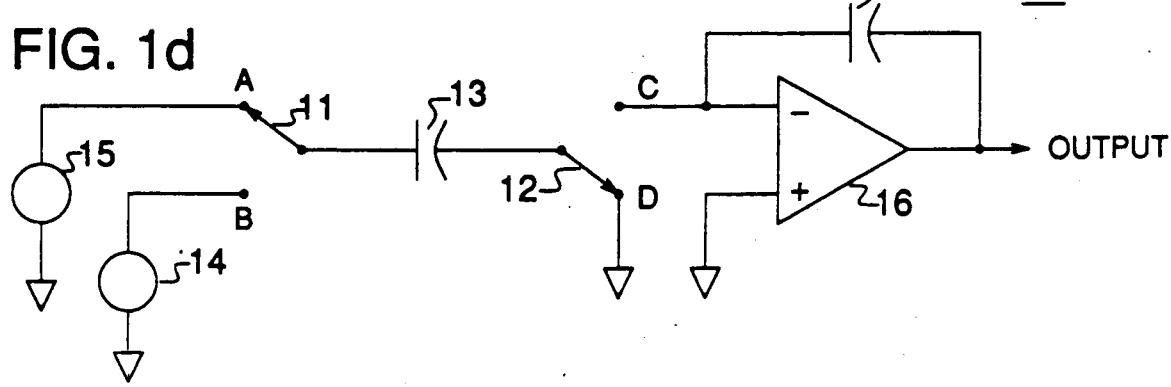

In FIG. 1a, the initial state is shown with capacitor 13 coupled between a first signal source 14 and ground. Next, in FIG. 1b, switch 12 is shown switched from the contact D coupled to ground to the contact C coupling to the virtual ground input of the amplifier 16. After switch 12 completes its operation, switch 11 switches the capacitor 13 to a second signal source 15, as shown in FIG. 1c. Switch 12 now returns to the contact D coupled to ground, as shown in FIG. 1d, completing a switching cycle of the switched-capacitor circuit. Note that neither switch 11 or 12 remains in an intermediate ("floating") state while the other switch operates.

Figure 2:
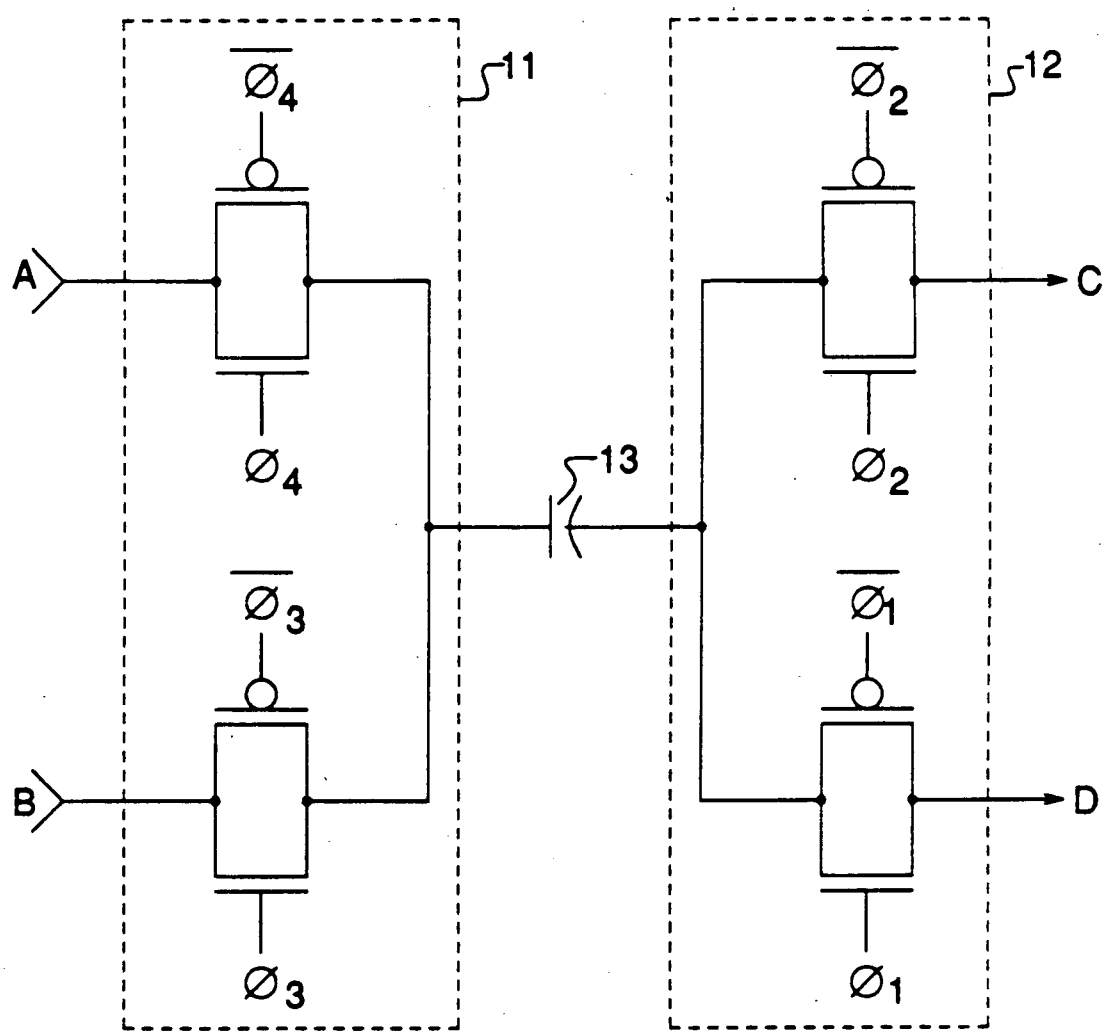
FIG. 2 is a schematic diagram of exemplary switches 11, 12 and capacitor 13 of FIGS. 1a-1d.
Figure 3:
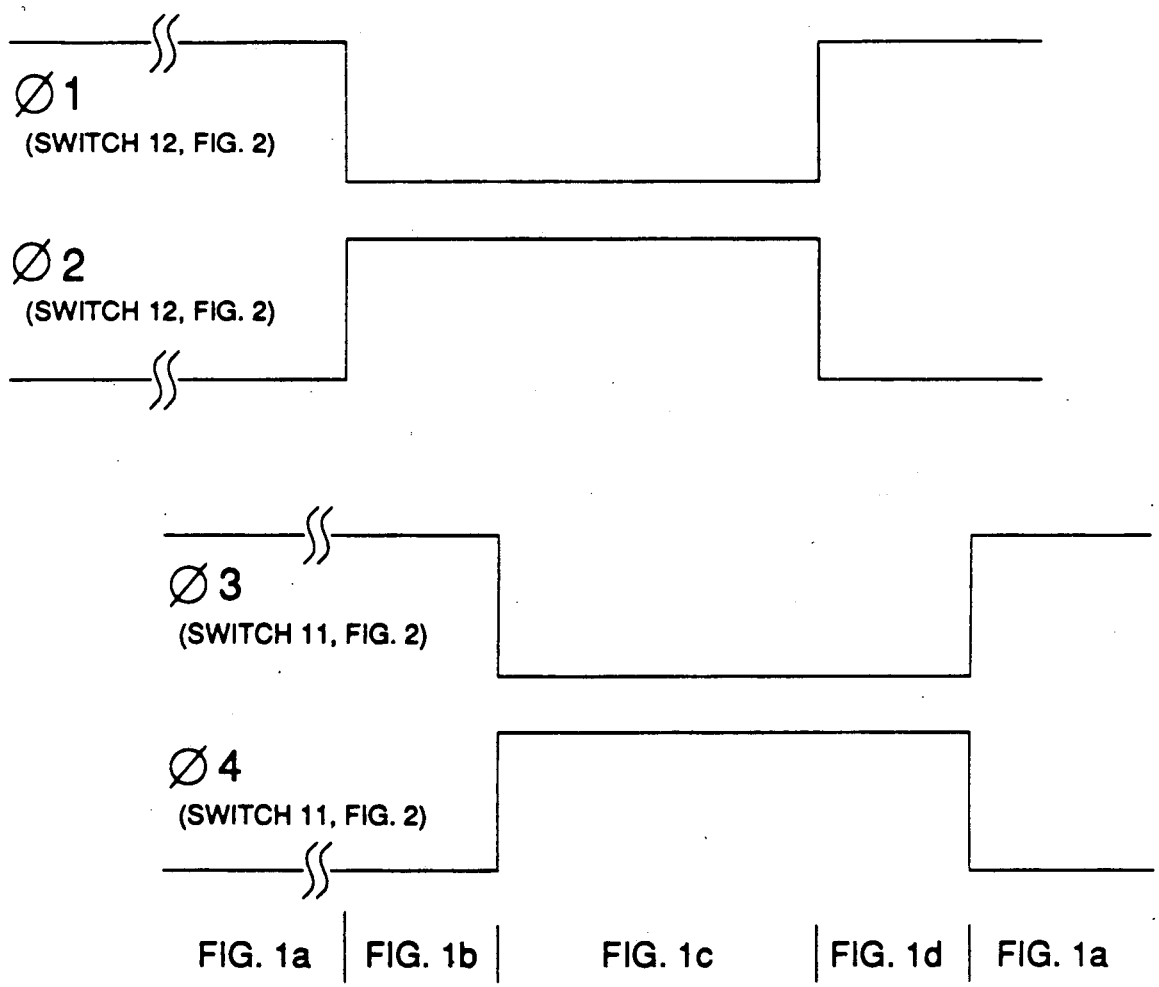
FIG. 3 is a timing diagram of an exemplary operation of the switches 11, 12 (FIGS. 1a-1d and 2) according to one embodiment of the invention; and, FIGS. 4a-4e are simplified schematic diagrams of a switched-capacitor filter demonstrating the method of switching the capacitor therein according to the prior art.
Figure 4A:
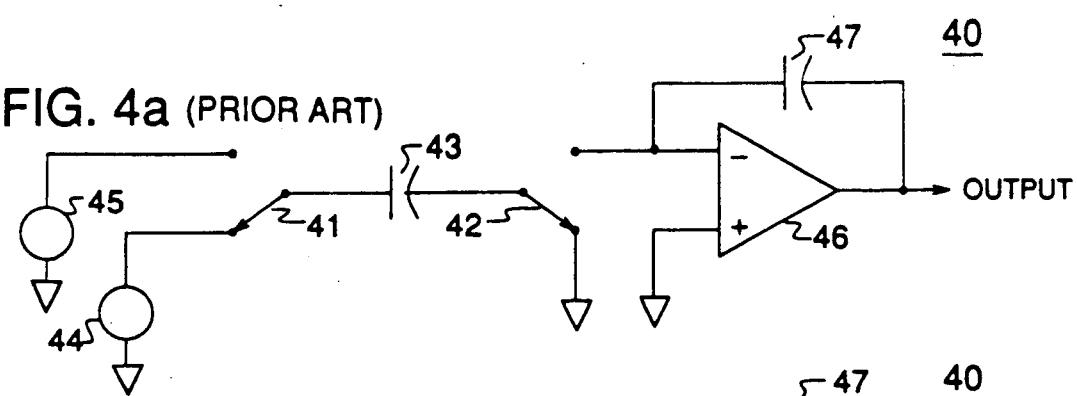
Figure 4B:
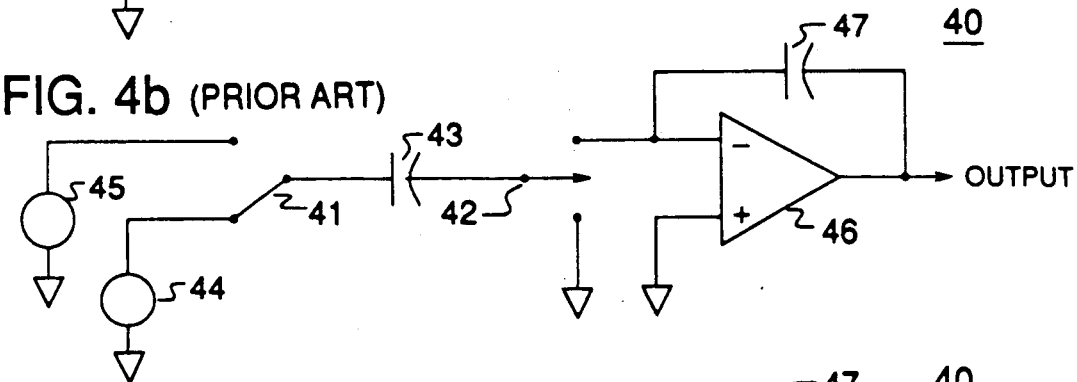
Figure 4C:
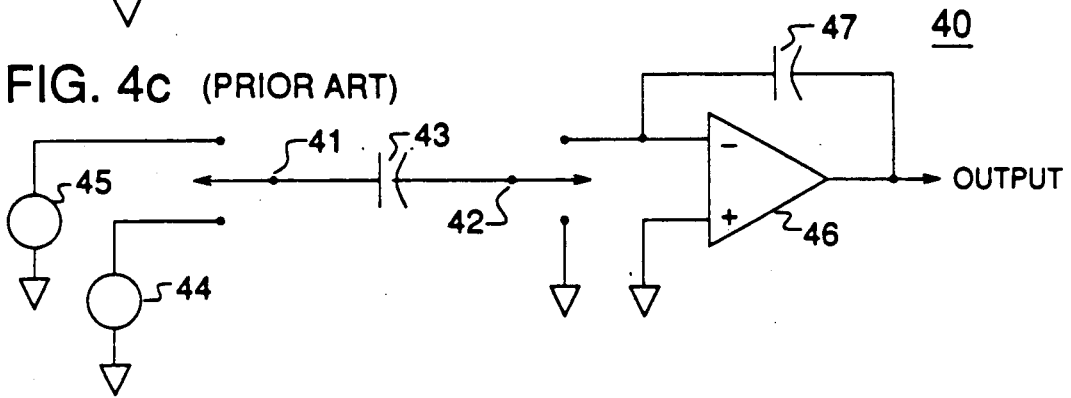
Figure 4D:
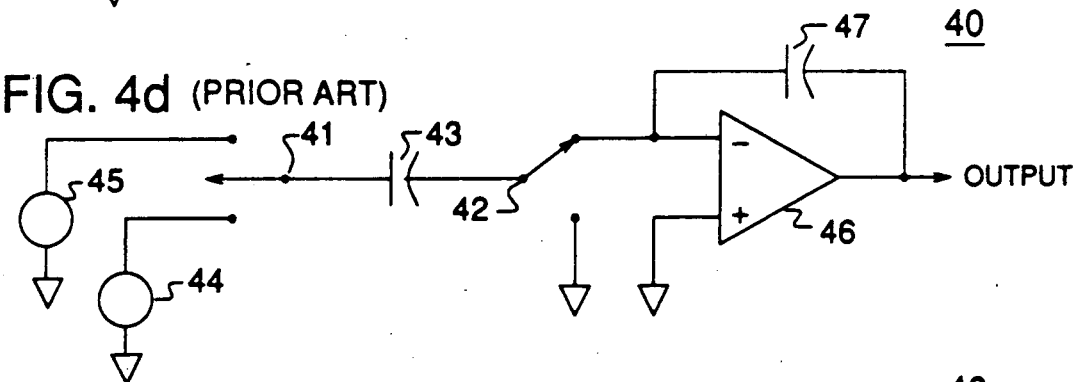
Figure 4E:
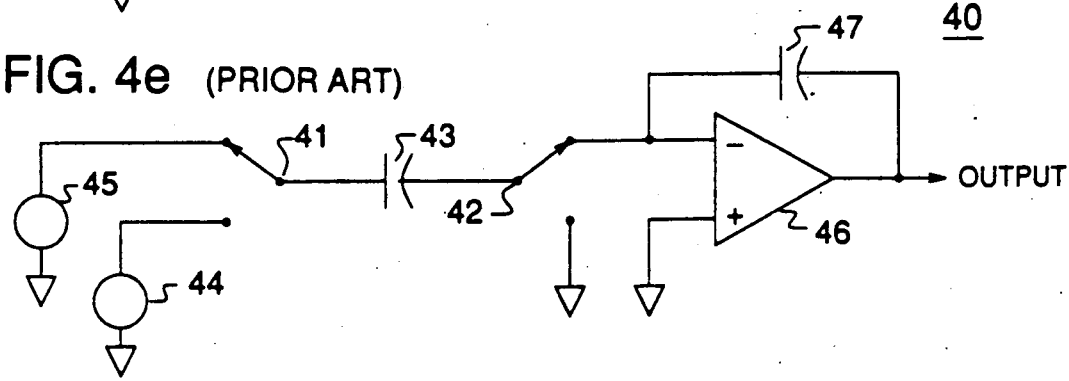

To better understand the operation sequence of the switches 11, 12 in the circuit 10, FIG. 2 shows an exemplary embodiment of the switches 11, 12 and the capacitor 13. FIG. 3 diagrams the clock signals used to drive the transistors in FIG. 2 to implement the sequence described above.

An exemplary switch 11, 12 is shown in FIG. 2. Pairs of transistors (not numbered), one an N-channel and the other a P-channel FET for CMOS implementations, make the connection between the common and the two contacts of each switch 11, 12 (A, B and C, D, respectively). The transistors in each pair are driven by corresponding ones of oppositely phased clock signal pairs $\phi 1$, $\phi 1-\phi 4$, $\phi 4$. The pairs of transistors provide a low impedance path for signals coupled thereby. For typical NMOS or PMOS implementations, a single transistor is used as a switch.

In FIG. 3, representative clock signals of the pairs of clock signals $\phi 1$, $\phi 1-\phi 4$, $\phi 4$ are shown for the four states of the circuit 10 (FIG. 1), corresponding to the figures FIGS. 1a–1d. For clarity, only the positive clock signals (those coupling to the N-channel transistors in FIG.2) are shown; when a clock signal is "high", the corresponding transistor pair in the switches 11, 12 (FIG. 2) are "on" or conducting. Conversely, when the clock signal is "low", the corresponding transistor pair is "off" or non-conducting. Further, the four states are exaggerated (not to scale) to make the operation of the switches 11, 12 more clear. For simplicity, the non-overlapping clock aspect to ensure the break-before-make action of the switches 11, 12, described above, has been removed.

The clock signals $\phi 1-\phi 4$ are shown to have the initial state of switch 11 (FIG. 2) coupling the common thereof to contact B and the common of switch 12 (FIG. 2) coupling to contact D. This corresponds to the state of the switched capacitor circuit 10 in FIG. 1a. Next, corresponding to FIG. 1b, the switch 12 operates and changes contacts from D to C. Shortly thereafter, the switch 11 operates to change contacts from B to A, corresponding to FIG. 1c. The circuit 10 (FIG. 1) remains in this state for a relatively long period to ensure the voltages in the circuit 10 have stabilized. The switch 12 again operates to change contacts from C back to D, as shown in FIG. 1d. Soon thereafter, the switch 11 operates, changing contacts back to B, as shown in FIG. 1a. This completes a switching cycle. It is understood that the duration of the state represented by FIG. 1a is approximately the same as the duration of the state represented by FIG. 1c. Similarly, the duration of the state represented by FIG. 1b is approximately the same as the duration of the state represented by FIG. 1d.

Although the S-C circuit 10 described above is shown having only one amplifier 16 with a virtual ground input, another amplifier having a virtual ground input may be substituted for the ground connection to contact D of switch 11. Further, the circuit may implemented in fully differential form, with the circuits duplicated and operating in parallel.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. A method of switching a capacitor in a switched-capacitor circuit, the circuit having at least:

first and second switches, each having two contacts and a common;

a capacitor connected between the commons of the two switches;

a first signal source coupling to one contact of the first switch; and, a first amplifier having a virtual ground input, the virtual ground input coupling to one contact of the second switch;

characterized by the step of:

switching the first switch directly from one contact to the other contact thereof; and then, switching the second switch directly from one contact to the other contact thereof;

wherein the first switch completes switching before the second switch switches.

2. The method of switching a capacitor in a switched-capacitor circuit as recited in claim 1, wherein a second signal source is coupled to the remaining contact of the first switch.

3. The method of switching a capacitor in a switched-capacitor circuit as recited in claim 2, wherein the remaining contact of the second switch is coupled to a reference voltage.

4. The method of switching a capacitor in a switched-capacitor circuit as recited in claim 3, wherein the voltage of the reference voltage is substantially equal to ground.

5. The method of switching a capacitor in a switched-capacitor circuit as recited in claim 2, wherein the remaining contact of the second switch is coupled to the virtual ground input of a second amplifier.

* * * * *